United States Patent
Awata et al.

(10) Patent No.: US 7,818,086 B2
(45) Date of Patent: Oct. 19, 2010

(54) COMPONENT MOUNTER, WARNING NOTIFICATION APPARATUS, AND WARNING NOTIFICATION METHOD

(75) Inventors: Yoshiaki Awata, Fukuoka (JP); Kazuhiko Itose, Fukuoka (JP); Kenichiro Ishimoto, Saga (JP)

(73) Assignee: Panasonic Corporation, Osaka (JP)

( * ) Notice: Subject to any disclaimer, the term of this patent is extended or adjusted under 35 U.S.C. 154(b) by 276 days.

(21) Appl. No.: 12/236,729

(22) Filed: Sep. 24, 2008

(65) Prior Publication Data

US 2009/0082881 A1 Mar. 26, 2009

(30) Foreign Application Priority Data

Sep. 25, 2007 (JP) ............................. 2007-247037
Aug. 21, 2008 (JP) ............................. 2008-213134

(51) Int. Cl.
*G06F 19/00* (2006.01)
*G06F 11/30* (2006.01)
*G06F 7/04* (2006.01)
*G01R 31/26* (2006.01)

(52) U.S. Cl. .................. 700/121; 700/108; 702/185; 438/15; 726/5; 726/18; 726/19

(58) Field of Classification Search .................. 700/80, 700/108–110, 121, 185; 702/183, 185; 726/4, 726/5, 17–19; 382/145, 151; 438/15
See application file for complete search history.

(56) References Cited

U.S. PATENT DOCUMENTS 6,766,210 B2 * 7/2004 Jun et al. ..................... 700/110
7,035,774 B2 * 4/2006 Fujiwara et al. ............. 702/188

FOREIGN PATENT DOCUMENTS

JP 9-326599 12/1997

* cited by examiner

*Primary Examiner*—Sean P Shechtman
(74) *Attorney, Agent, or Firm*—Wenderoth, Lind & Ponack, LLP.

(57) ABSTRACT

An component mounter including a warning notification apparatus, which includes a warning generating unit which generates a warning for notifying that an action involving human resource is required, by referring to warning generation information, a warning level judging unit which judges a level of the warning indicating difficulty of an action to be taken in response to the warning by referring to warning level judgment information, and a warning notification unit which specifies an operator permitted to perform the action in response to the warning by referring to execution permission authentication information, and outputs the warning notifying the specified operator of the warning.

8 Claims, 8 Drawing Sheets

| Warning generation information | | |
|---|---|---|
| Input signal | Warning to be generated | Group of operations |
| a | [1] | I |
| b∪c | [2] | III |
| d∩e | [3] | VII |
| ---- | ---- | ---- |

(B)

| Warning level judgment information | | |
|---|---|---|
| | Level | Group of operations |
| Low level (General operation) | 1 | I |
| | 2 | II、III |
| | 3 | IV |
| High level (Management operation) | 4 | V、VI |
| | 5 | VII |

(C)

| Execution permission authentication information | | | | | | |
|---|---|---|---|---|---|---|
| Warning level | | | | | Authenticated operator | |
| Level 1 | Level 2 | Level 3 | Level 4 | Level 5 | Name | ID |
| ○ | ○ | ○ | ○ | ○ | A | P001 |
| | | | ○ | ○ | B | P002 |
| ○ | ○ | ○ | | | C | P003 |
| ○ | ○ | | | | D | P004 |
| ---- | ---- | ---- | ---- | ---- | ---- | ---- |

FIG. 8

| Execution permission authentication information | | | | | | |
|---|---|---|---|---|---|---|
| Warning level | | | | | Authenticated operator | |
| Low level (General operation) | | | High level (Management operation) | | | |
| Level 1 | Level 2 | Level 3 | Level 4 | Level 5 | Name | ID |
| I | II、III | IV | V、VI | VII | | |
| ○ | ○ | ○ | ○ | ○ | A | P001 |
| | | | ○ | ○ | B | P002 |
| ○ | ○ | ○ | | | C | P003 |
| ○ | ○ | | | | D | P004 |
| ---- | ---- | ---- | ---- | ---- | ---- | ---- |

FIG. 9

| Warning generation information | | |
|---|---|---|
| Input signal | Warning to be generated | Level |
| a | [1] | 1 |
| b∪c | [2] | 2 |
| d∩e | [3] | 5 |
| ---- | ---- | ---- |

COMPONENT MOUNTER, WARNING NOTIFICATION APPARATUS, AND WARNING NOTIFICATION METHOD

BACKGROUND OF THE INVENTION (1) Field of the Invention

The present invention relates to a component mounter that mounts components such as electronic components on a board, to a warning notification apparatus which notifies an operator of a warning informing that an action involving human resource is required in apparatuses such as a component mounter, and to a warning notification method thereof.

(2) Description of the Related Art

In a component mounting system which manufactures mounted boards by mounting components such as the electronic components, component mounters for mounting the electronic components to the boards are connected.

When the component mounters are in operation, various incidents occur. The incidents include, for example, that the component mounters stop operating when the component mounter ran out of components or when a mechanical trouble occurs, which requires actions of operator who is operating the component mounter.

Occurrence of these incidents is automatically detected by a detection function included in the component mounters. Furthermore, a notification unit utilizing a signaling light or a display panel notifies a warning informing that the actions involving human resources are required.

The operator who received the warning accesses the component mounter and takes actions such as refilling components and recovering mechanical troubles.

For this reason, a conventional component mounter including display function for displaying necessary guidance information to inform the operation of the equipment and operating status so that the operator can appropriately perform the actions has been known (for example, see Patent Reference 1: Japanese unexamined patent application publication No. 9-326599).

Meanwhile, along with the advancement of functions of apparatuses used for component mounting, more diverse information regarding operating status can be automatically detected. Furthermore, various types of information notified as warning or guidance from a facility is now available.

For example, the component mounter can display, in addition to the warning which requires instant actions, or a message prompting maintenance of each unit indicating that the component mounters runs out of components, or the component mounters stop operating due to mechanical troubles or a clog in the pickup nozzle, a warning prompting judgment on the available actions for enhancing productivity by improving the operating status of the apparatus, which is closer to a recommendation.

The former is a type of warning to be notified to operators who are residing the component mounting line and operating the component mounters. The latter is a type of warning to be notified to management operators who are higher level operators capable of comprehensive judgment regarding the process necessary to enhance productivity.

However, in the conventional technology including the technology disclosed in Patent Reference 1, the Japanese unexamined patent application publication No. 9-326599, the warning has been notified using the signaling light and display panels without specifying a target to be notified.

As a result, although the warning which obviously requires a prompt action is appropriately responded upon the judgment of the operator himself, there are cases where the operator cannot appropriately respond to the warning for enhancing productivity, including details which require high-level judgment.

Consequently, there are cases where the warning notified by the function of the component mounter is left and not transmitted to the management operator who was to be notified, resulted in an opportunity loss.

On the other hand, there are cases where the warning which requests a simple operation is notified to the management operator who is not supposed to respond the warning, resulted in inefficiency by troubling the management operator.

As described above, in the conventional technology, there is a problem that the details of warning are not effectively used for enhancing productivity since the correspondence between the difficulty of the action in response to the warning to be notified and the operators to be notified is not clarified.

SUMMARY OF THE INVENTION

In view of the problems above, it is an object to provide a component mounter, a warning notification apparatus, and a warning notification method which improves certainty of transmission of the warning to be notified to the operator originally to be notified, thereby effectively utilizing the detail of warning to enhance productivity.

The component mounter according to the present invention is a component mounter provided with a component mounting mechanism which picks up a component from a component supply unit, transfers and mounts the component on a board transported by a board transport mechanism, a position of the board determined and held by a board positioning unit, the component mounter including: a control unit configured to operate a mechanism unit by executing an operating program, the mechanism unit including at least the component mounting mechanism, the component supply unit, the board transport mechanism, and the board positioning unit; a sensor which detects a mechanical status of the mechanism unit and outputs a signal according to the detected status; a warning generating unit which generates a warning, by referring to warning generation information in which a type of the signal outputted from the sensor or a type of the signal outputted from the control unit when the control unit executes the operating program, and a type of the warning are associated with each other, the warning being for notifying that an action involving human resource is required; a warning level judging unit which judges a level of the warning by referring to warning level judgment information in which information related to the warning and the level of the warning are associated with each other, the warning being generated by the warning generating unit, and the level of the warning indicating difficulty of an action to be taken in response to the warning; and a warning notification unit which specifies an operator permitted to perform the action in response to the warning by referring to execution permission authentication information in which the level and information for identifying the operator are associated with each other, the warning generated by the warning generating unit, and the level of warning judged by the warning level judging unit, and to output the warning notifying the specified operator of the warning.

With this configuration, the component mounter according to the present invention can judge the level of each generated warning.

The component mounter according to the present invention specifies the operator according to the judged level, and can notify the specified operator of the warning.

Accordingly, each of the warning is notified of the operator according to the level of the warning, more specifically, the difficulty of the action required for the warning.

More specifically, each of the warning is notified of the operator to be notified of the warning, thereby securing effectiveness of the warning. As a result, the details of the warning can be effectively utilized for enhancing productivity.

The warning notification apparatus according to the present invention is a warning notification apparatus which notifies a warning that an apparatus included in a component mounting system for mounting a component on a board requires an action involving a human resource, in which the apparatus included in the component mounting system include: a control unit which operates the apparatus through execution of an operating program; and a sensor which detects a mechanical status of the apparatus and outputs a signal according to the detected status, and the warning notification apparatus includes: a warning generating unit which generates a warning, by referring to warning generation information in which a type of the signal outputted from the sensor or a type of the signal outputted from the control unit when the control unit executes the operating program, and a type of the warning are associated with each other; a warning level judging unit which judges a level of the warning by referring to warning level judgment information in which information related to the warning and the level of the warning are associated with each other, the warning being generated by the warning generating unit, and the level of the warning indicating difficulty of an action to be taken in response to the warning; and a warning notification unit which specifies an operator permitted to perform the action in response to the warning by referring to execution permission authentication information in which the level and information for identifying the operator are associated with each other, the warning generated by the warning generating unit, and the level of warning judged by the warning level judging unit, and to output the warning notifying the specified operator of the warning.

With this configuration, the warning notification apparatus according to the present invention can notify the operator according to a warning of the warning suitable for each case in apparatuses such as a board supplying apparatus, a printer, a adhesive applicator, a component mounter, a reflow furnace, and an appearance tester, for example, when a trouble occurs, or when there is a possibility of trouble, when there is a possibility of lowered operation efficiency More specifically, each of the warning is notified of the operator to be notified of the warning, thereby securing effectiveness of the warning. As a result, the details of the warning can be effectively utilized for enhancing productivity.

The warning notification method according to the present invention is a warning notification method performed by a warning notification apparatus which notifies that a component mounter which picks up, by a component mounting mechanism, a component from a component supply unit, transfers and mounts the component on a board transported by a board transport mechanism, a position of the board determined and held by a board positioning unit, requires an action involving a human resource, in which the component mounter includes: a control unit which operates, by executing an operating program, a mechanism unit including at least the component mounting mechanism, the board transport mechanism, the component supply unit, and the board positioning unit; and a sensor which detects a mechanical status of the mechanism unit and outputs a signal according to the detected status, the warning notification method includes: generating a warning by referring to warning generation information in which a type of the signal outputted from the sensor or a type of the signal outputted from the control unit when the control unit executes the operating program, and a type of the warning are associated with each other, the warning being for notifying that an action involving human resource is required; judging a level of the warning by referring to warning level judgment information in which information related to the warning and the level of the warning are associated with each other, the warning generated in the generating and the level of the warning indicating difficulty of an action to be taken in response to the warning; specifying an operator permitted to perform the action in response to the warning by referring to execution permission authentication information in which the level judged by the warning level judging unit and information for identifying the operator are associated with each other, the warning generated by the warning generating unit; and outputting the warning to notify the specified operator of the warning.

With the processes, the warning notification method according to the present invention can notify the operator who is to be notified of each of the warning generated by the method. This secures the effectiveness of the warning, and enables effective utilization of the details of warning for enhancing productivity.

Furthermore, the present invention may also be realized as a program causing a computer to execute the characteristic steps in the warning notification method according to the present invention, or as a recording medium such as CD-ROM on which the program is stored, or as an integrated circuit. The program may also be distributed via the transmission medium such as a communication network.

With the component mounter and the warning notification method according to the present invention, a warning for notifying that the component mounter requires an action involving human resource is generated, and the level of the warning is judged.

The component mounter according to the present invention specifies the operator according to the judged level, and notifies the specified operator of the warning.

Furthermore, the warning notification apparatus according to the present invention generates a warning for notifying that the component mounter requires an action involving human resource, and judges the level of the warning. Furthermore, the warning notification apparatus according to the present invention specifies the operator according to the judged level, and notifies the specified operator of the warning.

As described above, the present invention can notify an operator of the warning after specifying the operator to be notified of the warning. For example, the warning requiring a simple operation is notified of a general operator, and the warning requiring a complex operation is notified of a senior operator.

This secures effectiveness of the warning, and enables effective utilization of the details of the warning for enhancing productivity. In addition, for each operator, the operations matching the operators own capability and assignment are required, and thus each operator can effectively carry on operations without ineffective actions.

FURTHER INFORMATION ABOUT TECHNICAL BACKGROUND TO THIS APPLICATION

The disclosure of Japanese Patent Applications No. 2007-247037 filed on Sep. 25, 2007 and No. 2008-213134 filed on Aug. 21, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 5 (A) shows an example of data configuration of warning generation information;

FIG. 5 (B) shows an example of data configuration of the warning level judgment information;

FIG. 5 (C) shows an example of data configuration of execution permission authentication information;

FIG. 8 shows an example of data configuration of the execution permission authentication information including information necessary for judging a warning level; and FIG. 9 shows an example of data configuration of the warning generation information including information necessary for judging the warning level.

DESCRIPTION OF THE PREFERRED EMBODIMENT(S)

The embodiment of the present invention will be hereafter described with reference to the drawings.

First, the configuration of a component mounting system capable of manufacturing mounted boards by mounting electronic components on boards is described with reference to FIG. 1.

Figure 1:
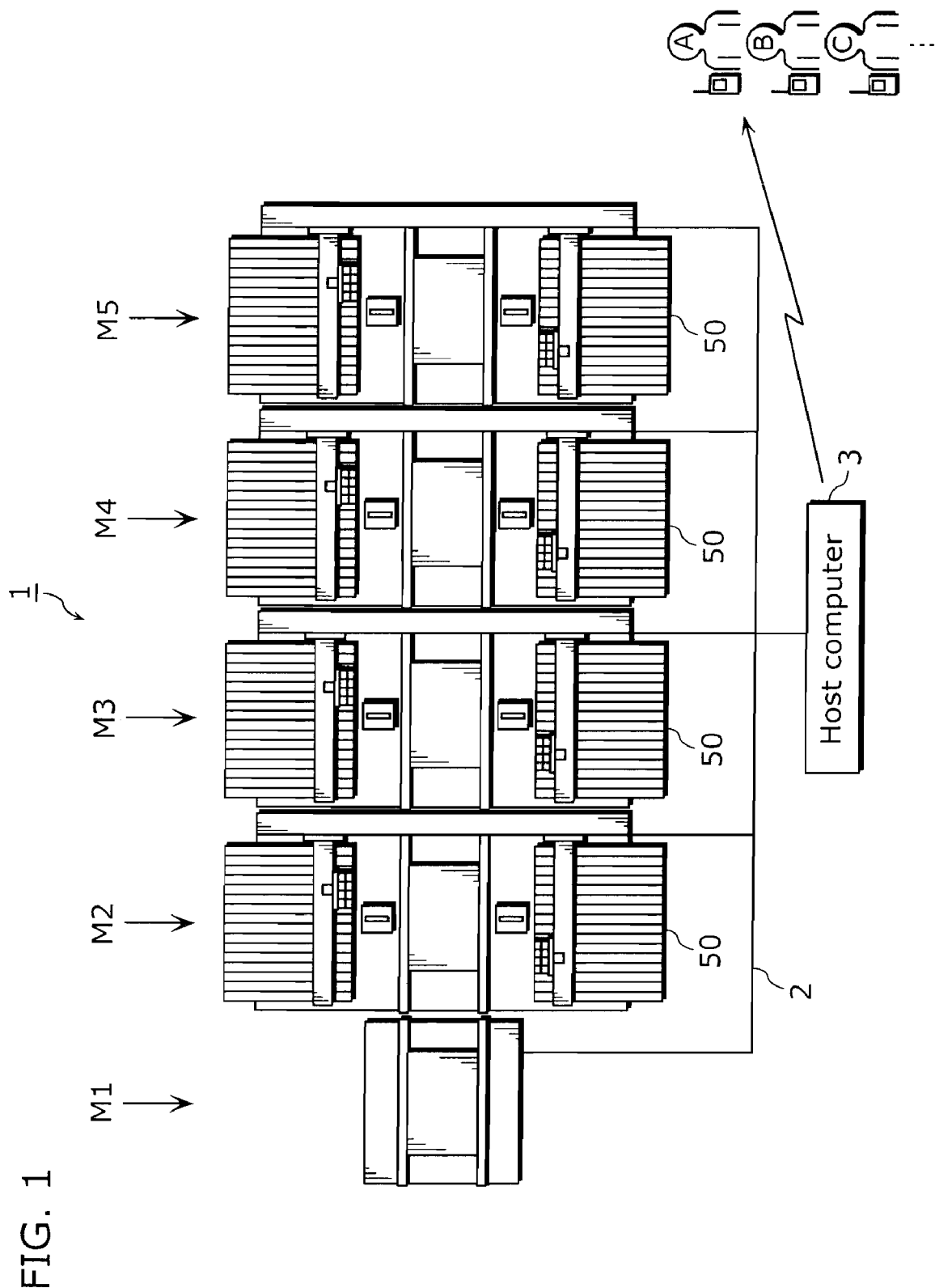
FIG. 1 shows configuration of a component mounting system according to the embodiment of the present invention.

FIG. 1 shows the configuration of the component mounting system according to this embodiment of the present invention.

In FIG. 1, the component mounting system 1 includes component mounters 50 that are serially connected on the downstream side of the board supplying apparatus M1. The component mounting system 1 is a system for manufacturing mounted boards by mounting components such as electronic components.

Note that the component mounters 50 are respectively referred to as M2, M3, M4, and M5, in order to distinguish the component mounters one another.

The component mounters M2 to M5 have the same configuration, and are mutually connected to one another via the LAN system 2, and are connected to the host computer 3. The total operation of the component mounting system 1 is controlled as a whole by the host computer 3.

The board supplying apparatus M1 is capable of storing multiple non-mounted boards, and supplying the boards to the device M2 on the downstream side one by one. The board supplied, by the board supply apparatus M1, to the component mounter M2 on the downstream side is transported to the downstream side, namely, to the component mounters M2, M3, M4, M5, in that order, and the electronic components are mounted on each board in the transportation process by the component mounters.

In addition, each of the component mounters M2 to M5 is capable of notifying a specified operator among multiple operators (A, B, C . . . ) by communication function of the wireless LAN in the host computer 3.

In this embodiment, the warning is sent to the information receiving terminal carried by the specified operator. The warning notification function in the component mounters M2 to M5 will be described later with reference to FIG. 4 and others.

Next, the configuration of each of the devices, in other words, the component mounter 50 is described with reference to FIG. 2 and FIG. 3.

Figure 2:
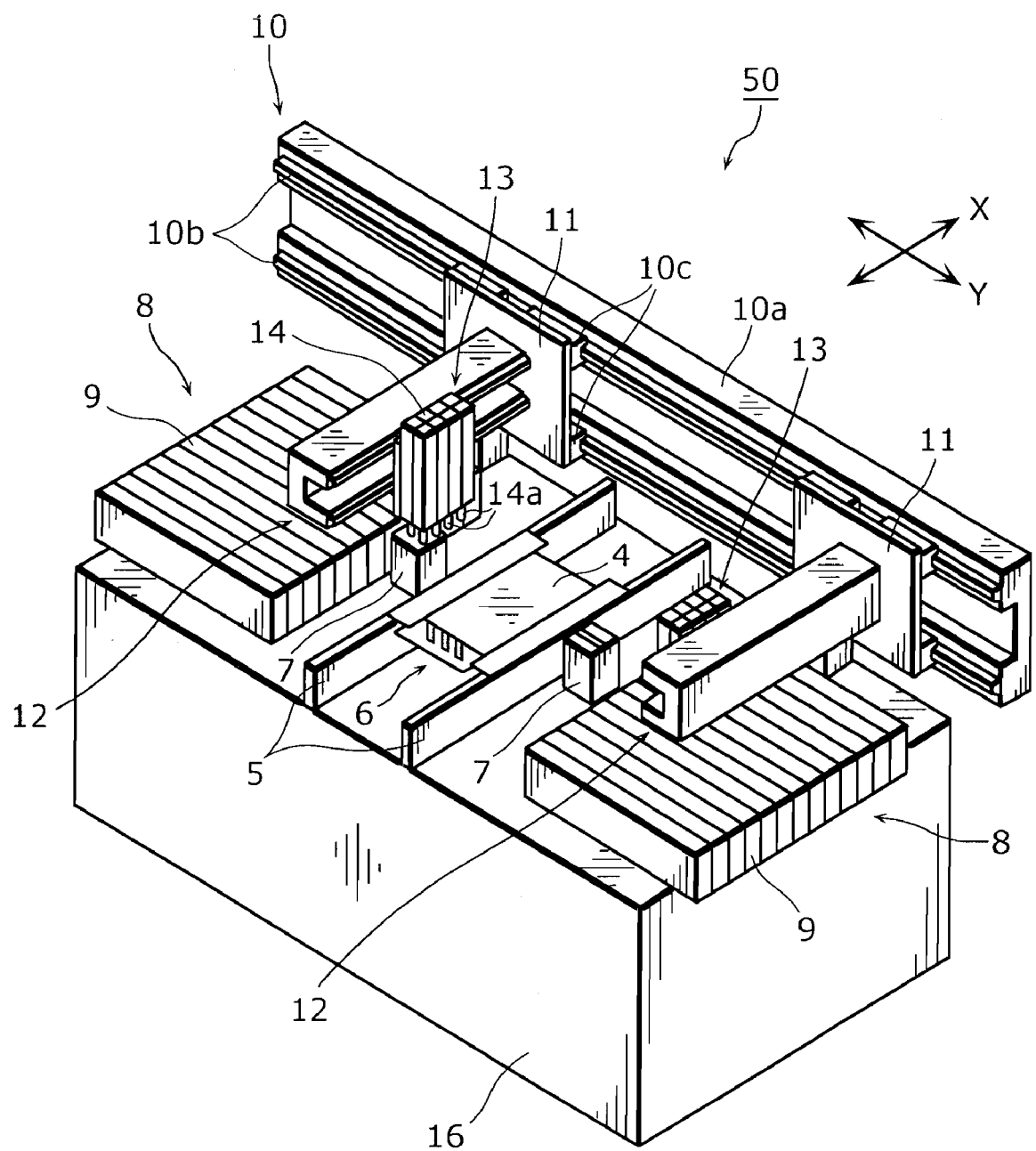
FIG. 2 is a perspective view of the component mounter according to the embodiment of the present invention.

FIG. 2 is a perspective view of the component mounter 50 according to this embodiment. FIG. 3 is a plan view of the component mounter 50.

The component mounter 50 according to this embodiment is capable of taking electronic components out of the component supply unit 8 by the component mounting mechanism 17, and capable of transporting and mounting the taken electronic components to a board which is transported by the board transport mechanism 5 and the position of the board is determined and held by the board positioning unit 6.

Figure 3:
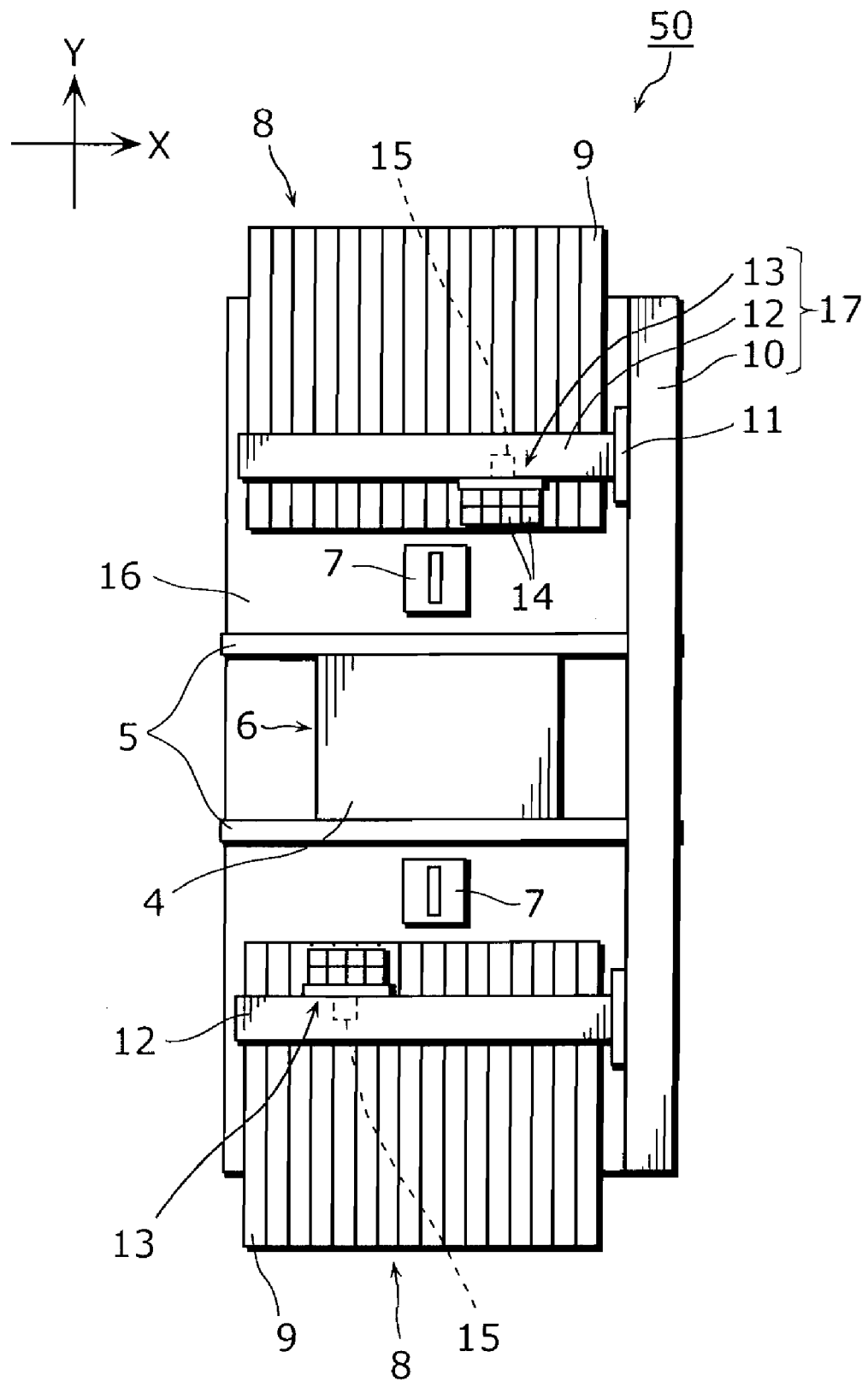
FIG. 3 is a perspective view of the component mounter according to the embodiment of the present invention.

In FIG. 2 and FIG. 3, the board transport mechanism 5 is provided on the base 16 in an X-axis direction. The board positioning unit 6 is provided on a transportation path of the board transport mechanism 5. The board 4 which is supplied from the apparatus on the upstream side and components are to be mounted is transported to the board positioning unit 6 by the board transport mechanism 5.

The board positioning unit 6 determines the position of the board 4 on a component mounting position by holding the transported board 4 with a support from below. The component mounting on the board 4 by the component mounting mechanism 17 is performed in this state.

The board 4 on which the component mounting is completed is transported to the downstream side again by the board transportation mechanism 5, and is taken out to the component mounter on the downstream side.

The component supply units 8 are provided on both sides of the board transport mechanism 5, and tape feeders 9 are attached to each component supply unit 8. The tape feeder 9 supplies electronic components held by carrier tape to the component mounting mechanism 17 described below.

The Y-axis moving table 10 including the linear driving mechanism is provided horizontal to the Y-axis direction on an edge of the base 16 in the X-axis direction.

The Y-axis moving table 10 is mainly composed of the beam member 10a provided in a horizontal direction and having elongated shape. The linear rails 10b are provided horizontally on the beam member 10a. Two rectangular-shaped connecting brackets 11 are slidably attached to the Y-axis direction to the linear rails 10b via the linear blocks 10c.

X-axis moving tables 12 including linear driving mechanisms, in the same manner as the Y-axis moving table 10, are respectively connected to the two connecting brackets 11. The mounting head 13 is movably attached on each of the X-axis moving table 12 in the X-axis direction.

The mounting head 13 is a multiple-serial type head including multiple (8 in this embodiment) heads 14. Pickup nozzles 14a each of which picks up and holds electronic components are attached at the lower end of each of the heads 14. The pickup nozzle 14*a* individually rises and falls by the nozzle lifting mechanism incorporated in the head 14.

The head moving mechanism is composed of the Y-axis moving table 10 and the X-axis moving table 12. With the head movement mechanism, the mounting head 13 moves along the X-axis direction and the Y-axis direction. As described above, each head 14 takes electronic components out of the tape feeders 9 in the component supply unit 8, and transports the electronic components to the board 4 whose position is determined by the board positioning unit 6, and mounts the components.

More specifically, the component mounting mechanism 17 which transfers and mounts electronic components to the board 4 includes the Y-axis moving table 10 and a set of X-axis moving table 12 and a mounting head 13.

In addition, the component recognition camera 7 is provided between the component supply unit 8 and the board transport mechanism 5. The component recognition camera 7 captures electronic component held by the mounting head 13 when the mounting head 13 takes out the electronic component from the component supply unit 8 and moves above the component recognition camera 7.

The board recognition camera 15 which is located below the X-axis moving table 12 and moves along the mounting head 13 is attached to the mounting head 13. Along with the move of the mounting head 13, the board recognition camera 15 moves above the board 4 held by the board positioning unit 6, and capture an image of the board 4.

When the mounting head 13 mounts the electronic components to the board 4, the mounting positions are adjusted with respect to the predetermined mounting position.

More specifically, the imaging result of electronic component by the component recognition camera 7 and the imaging result of the board by the board recognition camera 15 are processed by the recognition processing unit 24 (shown in FIG. 4, which is described later). The mounting position is corrected by adding the result of position recognition to a predetermined mounting position.

Note that the component recognition camera 7 also functions as a sensor which detects occurrence of pickup error in the pickup nozzle 14*a*, for example. In addition, the board recognition camera 15 also functions as a sensor which detects a holding error when the board positioning unit 6 holds the board 4.

More specifically, the component recognition camera 7 and the board recognition camera 15 also function as sensors which detect mechanical status in the mechanism unit 18.

Sensors for checking operations and monitoring status are provided on the component mounting mechanism 17, the component supply unit 8, the board transport mechanism 5, and the board positioning unit 6, respectively. When abnormality occurs while the component mounter is in operation, the sensors detects the status and outputs a signal according to the detected status.

For example, the sensor for checking operation such as a cylinder switch and a stroke edge detecting sensor outputs a predetermined signal at a normal timing and sequence that are set in advance when the mechanism is operating normally. However, when abnormality occurs in operation, these signals are missed, or generation timing of the signal shows irregularity. More specifically, signals showing signs of abnormality are generated from the sensors.

Signals showing abnormality are transmitted from dedicated sensors respectively provided with regard to the position displacement of the tape feeders 9 in the component supply unit 8, foreign material fallen into the mechanism, and a clog in the pickup nozzle 14*a* or in a valve.

Furthermore, the recognition processing unit 24 performs recognition process according to the predetermined algorithm on the obtained image, and when correct recognition result is not obtained caused by defect in an obtained image, the recognition processing unit 24 judges as a recognition error, and transmits a signal showing the recognition error.

Next, the configuration of the control system is described with reference to FIG. 4.

Figure 4:
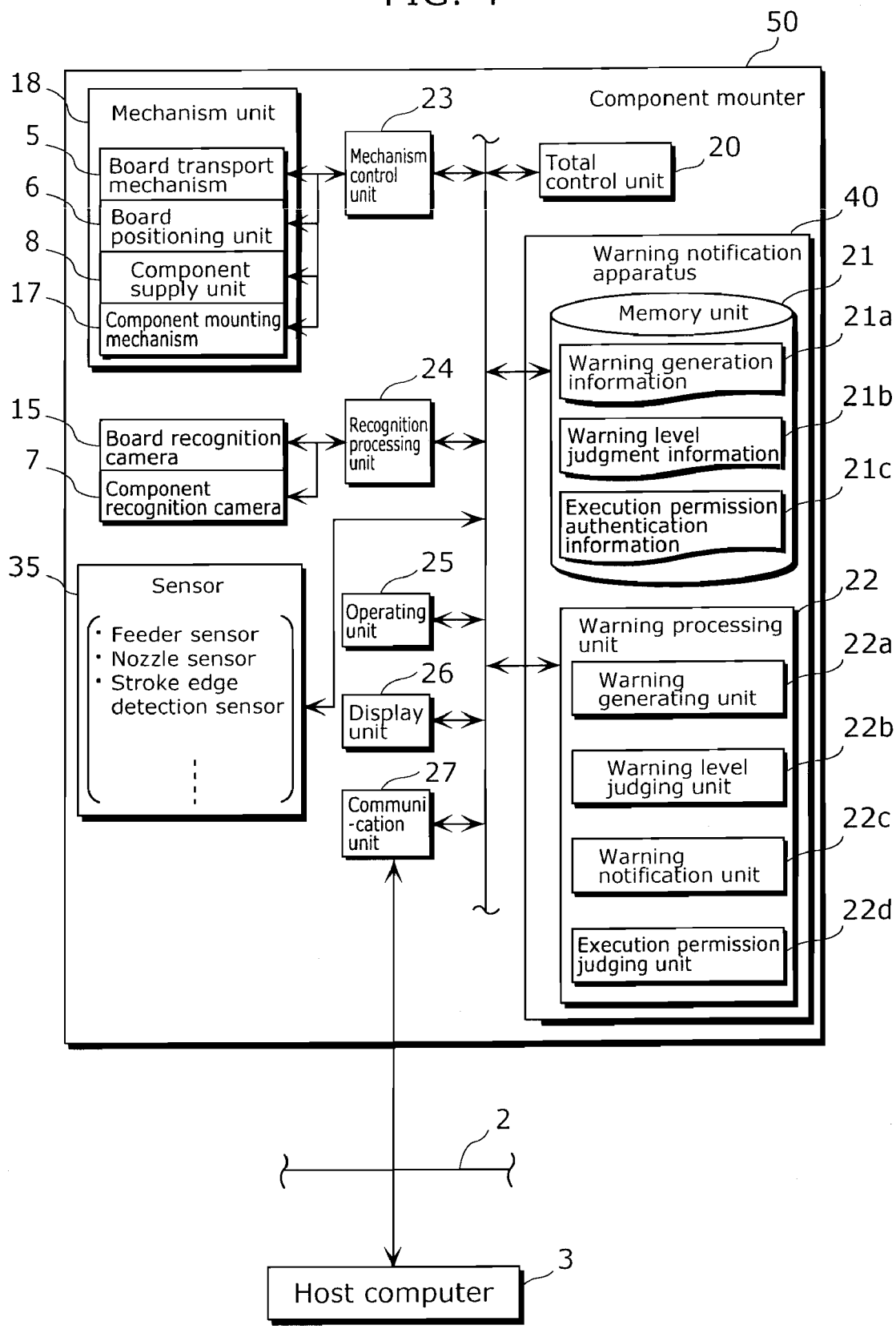
FIG. 4 is a block diagram showing configuration of a control system of the component mounter according to the embodiment of the present invention.

FIG. 4 is a block diagram showing configuration of the control system of the component mounter 50 according to this embodiment.

In FIG. 4, the total control unit 20 includes a CPU for processing, and performs overall control of the units described below.

The memory unit 21 stores programs and data necessary for operation and process for mounting electronic components on the board 4. The memory unit 21 further stores the warning generation information 21*a*, the warning level judgment information 21*b* and the execution permission authentication information 21*c* necessary for the warning processing which will be described below.

When the total control unit 20 executes the mounting operating program stored in the memory unit 21, the mechanism control unit 23 controls the mechanism unit 18 which at least includes the board transport mechanism 5, the board positioning unit 6, the component supply unit 8, and the component mounting mechanism 17.

Note that the total control unit 20 and the mechanism control unit 23 realize control function to the mechanism unit, included in the control unit of the component mounter according to the present invention.

In the process of the control by the mechanism unit 18, a signal indicating whether the program is executed normally or not is outputted from the total control unit 20 by the monitoring function incorporated in the operating program in advance.

For example, when the signal that shall be inputted from the sensor 35 which detects the status of the mechanism unit 18 is missing on the operation sequence, or when the signal is delayed longer than an accepted timing, it is judged that some abnormal operation occurs.

Note that multiple sensors are incorporated to the mechanism unit 18 as described above. However, for clearly describing the present invention, one of the sensors or a combination of two or more sensors among the multiple sensors is described as "sensor 35" in order to clearly describe the present invention.

More specifically, the component recognition camera 7 and the board recognition camera 15 also function as sensors which detect mechanical status in the mechanism unit 18 as described above. Thus, the component recognition camera 7 and the board recognition camera 15 may be included in the sensor 35.

As described above, in the component mounter 50 according to this embodiment, warning for informing that the component mounter requires an action involving human resource is generated based on one of, or both of a signal outputted from the sensor 35 according to the detected status when the mechanism unit 18 detects mechanical status, and a signal outputted from the total control unit 20 when the total control unit 20 executes the operating program to operate the mechanism unit 18.

More specifically, a warning according to the type of these signals (a type of signal or a combination of types of signals) is generated.

In this embodiment, as described below, these warnings are generated based on the warning generation information 21a, and judges the level of the detail of warning.

More specifically, the levels indicating the difficulties of actions to be performed in response to the warnings are defined and the execution permission authentication according to the capability of the operator and assignment to each operator.

The component mounter 50 according to this embodiment specifies the operator to execute the action according to the level of warning to be generated and execution permission authentication assigned to each operator. Furthermore, the component mounter 50 notifies the specified operator of the warning in response to the specified operator.

The process from generation of the warning to notification is performed by the warning notification apparatus 40 included in the component mounter 50.

The warning notification apparatus 40 includes a memory unit 21 and a warning processing unit 22. The memory unit 21 stores warning generation information 21a, warning level judgment information 21b, and execution permission authentication information 21c.

The warning generation information 21a, the warning level judgment information 21b, and the execution permission authentication information 21c are used for the warning process described above. All of the information is created in advance and stored in the memory unit 21.

The warning generation information 21a is for associating, with each warning, an input signal for warning generation processing, more specifically, a signal outputted from the sensor 35, a signal outputted from the total control unit 20 when executing the operating program, and a combination of these signals.

The example of data configuration of the warning generation information 21a will be described with reference to FIG. 5 (A).

The warning level judgment information 21b defines correspondence of each warning and the levels of execution permission authentication. The example data configuration of the warning level judgment information 21b will be described later with reference to FIG. 5 (B).

The execution permission authentication information 21c indicates the level of execution permission authentication assigned to each operator working at the production line. The example of data configuration of the execution permission authentication information 21c will be described with reference to FIG. 5 (C).

Here, the execution permission authentication is, what is called, an operating license assigned, in advance, to each worker who is possible to perform actions (operating) in response to the warning according to the difficulty of the detail of warning. For each operator, one or more execution permission authentication is set in advance according to, for example, capability or appointment.

Note that the information is stored in the memory units 21 in the component mounters M2 to M5, respectively. However, the information may be stored in the host computer 3 as a database commonly used by the component mounters M2 to M5.

The warning processing unit 22 is capable of executing the notification process to the operator based on the information. The warning processing unit 22 includes a warning generating unit 22a, a warning level judging unit 22b, a warning notification unit 22c, and an execution permission judging unit 22d, which are described below.

The warning generating unit 22a generates types of warning for notifying that the component mounter 50 requires some actions involving human resources based on the warning generation information 21a which is determined in advance and stored in the memory unit 21.

This warning is generated, as described above, based on the signal outputted from the sensor 35 according to a status of the mechanism 18 when the sensor 35 detects mechanical status in the mechanism unit 18 which at least includes the component mounting mechanism 17, the component supply unit 8, the board transport mechanism 5 and the board positioning unit 6, and the signal outputted from the total control unit 20 when the total control unit 20 executes the operating program to operate the mechanism 18, or in combination of these signals.

More specifically, with the input of these signals to the warning generating unit 22a generates warning associated with the type of individual input signals or a combination of the types of input signals is generated based on the warning generation information 21a.

FIG. 5 (A) shows an example of the data configuration of warning generation information 21a.

In the warning generation information 21a, the types of signals outputted from the sensor 35, the types of signals outputted from the total control unit 20, and the types of warning are associated with one another.

More specifically, as shown in FIG. 5 (A), the correspondence of the input signal 28a and the warning to be generated 28b are recorded in the warning generation information 21a.

Note that the codes such as "a" in the input signal 28a denote the types of signals, and the numbers such as "[1]" in the warning to be generated 28b denote the types of warning.

As shown in FIG. 5 (A), there are cases where the input signal "a" and the warning "[1]" corresponds to each other one by one, and the input signals "b" or "c" corresponds to the warning "[2]". Alternatively, there are cases where the input signals "d" and "e" correspond to the warning "[3]".

Although not shown in FIG. 5 (A), there are various types of correspondences such as combining three or more input signals with one warning.

In addition, the groups of operations 28c each of which corresponds to each of the types of warnings are stored in the warning generation information 21a. The codes such as "I" shown in the groups of operations 28c represents the operations to be performed according to the warning, namely, the types of actions, and is a type of information related to the warning.

This specifies the group of operations to which the operation to be performed according to the warning generated by the warning generating unit 22a belongs to. The specifying process of the groups of operations is performed by the warning generating unit 22a or the warning level judging unit 22b.

The warning level judging unit 22b judges the level of the warning based on the specified group of operation and the warning level judgment information 21b.

Note that, in this embodiment, each of the operations corresponding to each warning generated by the warning generating unit 22a is included in one of the groups of operations "I" to "VII".

FIG. 5 (B) shows an example of data configuration of the warning level judgment information 21b.

The warning level judgment information 21b includes information related to the warning to be generated and the associated levels of the warning are associated each other.

More specifically, as shown in FIG. 5 (B), the correspondence between the level 29a and the group of operations 29b which is information related to the warning is recorded.

The level 29a classifies operations taken as actions in response to the detail of the warning to be generated into low-level general operation and high-level management operation according to the difficulty of operation, more specifically, the difficulty of judgment when executing the operation and the difficulty upon execution.

Furthermore, the groups of operations belonging to the general operation are classified into "I", the groups of operations in level 1, "II" and "III", the groups of operations in level 2, and "IV", the groups of operations in level 3 in the order of ascending difficulty.

In the same manner, the groups of operations belonging to the management operation are classified into, in the order of ascending difficulty, "V" and "VI", the groups of operations in level 4, and "VII", the groups of operations in level 5.

For example, the operations belonging to the groups of operations belonging to "V" is in level 4, which indicates that the operation is more difficult than the operations belonging to the group of operations "III", which is in level 2.

More specifically, the warning level judging unit 22b is a level of warning generated by the warning generating unit 22a, and judges the level showing the difficulty of the actions to be taken in response to the warning, by referring to the warning level judgment information 21b.

Here, the general operation is described. Incidents to be warned includes misalignment of the tape feeder 9, a clog in the pickup nozzle 14a, stuck foreign body in the board transport mechanism 5 and suspended operation of the component mounter due to an error in recognition when supplying components.

These incidents occur on a daily basis, and unconditional instant action is required to continue the operation, and no delay in response is accepted. There are many incidents like this.

The operations dealing with these incidents are classified into low-level operations which are to be executed by the line operator who is residing the production line and assigned as an operator.

More specifically, the warning requesting response to such incidents is easy to understand, and the operations taken as actions in response to the warning are clearly shown in the operation manuals. Accordingly, the operators who finished basic training can perform most of the operations without difficulty.

On the other hand, in the warning generated by the function of the component mounter, there is high-level warning for enhancing productivity by improving the operation status of component mounter, which is closer to recommendation. In other words, there are warnings which require management operation, which is in a level higher in difficulty than the general operations.

For example, each of the component mounters (M2 to M5) composing the component mounting system 1 has a function to automatically detect advance or delay compared to the production plan inputted in advance by measuring production efficiency of the component mounter (the number of manufactured board per unit hour, or take time indicating manufacturing time per board) in real time. In addition, it is possible to calculate production efficiency of the component mounter by simulation in advance.

For example, in the component mounter 50, the total control unit 20 calculates the advance and the delay compared with the production plan by actual measurement or simulation by executing the operating program. Furthermore, the component mounter 50 transmits the signal showing the advance or delay compared with the production plan that has been actually measured or calculated to the warning notification apparatus 40.

Furthermore, the warning notification apparatus 40 judges, for example, whether there is a measure to recover from the delay when the signal indicating that there is a delay compared to the production plan. For example, when received signal is recorded as input signal, the warning generation information 21a judges that there is an effective measure.

Furthermore, the warning notification apparatus 40 generates a warning corresponding to the input signal as an instruction warning for enhancing productivity when it is judged that there is an effective measure. The warning notification unit 22c which will be described notified of the operator of the warning to be generated.

Examples of an effective measure include update of so-called arrangement optimization. Arrangement optimization includes optimizing arrangement of the tape feeder 9 in the component supply unit 8 or mounting arrangement of the pickup nozzle 14a in the mounting head 13 according to the type of the board 4 which is to be mounted.

More specifically, the arrangement optimization is for improving the efficiency in operation as much as possible by eliminating unnecessary movement of the mounting head 13 when mounting components.

In recent years, in component mounters, a method which proceeds control of the component mounters has been introduced for responding external incidents which is difficult to predict such as mechanical trouble and timing when the components run out in real time and for maintaining high operational efficiency constantly in the background and proceed control of component mounters.

However, such an arrangement optimization requires rearrangement of the tape feeders 9 upon suspending the component mounters in operation. Accordingly, in consideration of the effort and time loss required for the rearrangement, it is necessary to comprehensively judge suitability of updating arrangement optimization.

Thus, when it is judged that there is advantage in updating arrangement optimization, the component mounter 50 notifies the warning prompting comprehensive judgment.

Such high-level warning is difficult to understand or judge for a line operator who is only qualified as an operator. Thus, the management operator who is assigned to the management engineer of the production line needs to be notified.

As described above, various levels of warnings are generated from the component mounter 50. Thus, when notifying the warning, efficiency of warning is lost upon notifying a warning, if the operator who has capacity according to the level of warning is not notified.

Thus in the component mounter 50 according to this embodiment, the warning level judging unit 22b judges the level of warning generated by the warning generating unit 22a.

The following are examples of generation of warning by the warning generating unit 22a and judgment of warning by the warning level judging unit 22b.

For example, when a signal "a" from the sensor 35 indicating components ran out is inputted to the warning generating unit 22a, the warning generating unit 22a refers to the warning generation information 21a, and generates the warning "[1]", indicating "exchanging the feeder which ran out of the components with a new feeder".

Furthermore, the warning generating unit 22a refers to the warning generation information 21a, specifies the group of operations "I" corresponding to the warning "[1]", and notifies the warning level judging unit 22b.

The warning level judging unit 22b refers to the warning level judgment information 21b and judges that the level corresponding to the notified group of operations "I" is "1".

In addition, when "d" and "e", a combination of signals indicating that the time necessary for exchanging feeder exceeds an acceptable range is inputted, the warning generating unit 22a refers to the warning generation information 21a, and generates the warning [3] indicating the optimization of the feeder arrangement minimizing the time necessary for exchanging feeder", for example.

Furthermore, the warning generating unit 22a refers to the warning generation information 21a, specifies the group of operations "VII" corresponding to the warning "[3]", and notifies the warning level judging unit 22b.

The warning level judging unit 22b refers to the warning level judgment information 21b and judges that the level corresponding to the notified group of operations "VII" is "5".

The warning notification unit 22c specifies an operator to whom the warning shall be notified, in other words, the operator to be notified, based on the warning level judged by the warning level judging unit 22b and the execution permission authentication information 21c.

FIG. 5 (C) shows an example of data configuration of the execution permission authentication information 21c.

The warning level and the information identifying operator are associated in the execution permission authentication information 21c.

More specifically, in the execution permission authentication information 21c the correspondence between the warning level 30a and the authenticated operator 30b is recorded.

The authenticated operator 30b is information showing the name of operators and their IDs. In the execution permission authentication information 21c, the warning level 30a corresponding to the operation that can be performed by each operator. More specifically, execution permission authentication according to the proficiency and capability is assigned to each operator.

The warning notification unit 22c performs process to notify the warning whose level is judged by the warning level judging unit 22b to the operator assigned to the execution permission authentication for the level is performed based on the execution permission authentication information 21c stored in the memory unit 21.

Note that, to the operations corresponding to the warning level with "O", execution permission authentication has been assigned to the operator recorded in the line including the column.

For example, the operator "A" is an all-round operator who can perform all of the groups of operations corresponding to level 1 to level 5, more specifically, all of the operations included in the groups of operations "I" to "VII".

Meanwhile, the operator "B" is a management operator, and execution permission authentication is only assigned to the management operation corresponding to the levels 4 and 5.

The operators "C" and "D" are respectively line operators to whom execution permission authentication for the general operations are assigned. Furthermore, no execution permission authentication is assigned to the group of operations "IV" corresponding to level 3 to the operator "D", which limits the executable range.

More specifically, the warning notification unit 22c specifies operators to whom execution permission authentication is assigned from among the operators registered at the execution permission authentication information 21c. Furthermore, warning is notified to the operator.

For example, as described above, when the warning generating unit 22a generates the warning "[1]" indicating "exchanging the feeder which runs out of components with a new feeder", the corresponding group of operations is "I" (see FIG. 5 (A)). Furthermore, the level corresponding to the group of operations "I" is "1" (see FIG. 5 (B)).

In this case, the warning notification unit 22c refers to the execution permission authentication information 21c, and specifies the operators "A", "C", and "D" to whom the execution permission authentication for level 1 is assigned. Furthermore, the warning notification unit 22c specifies "A" recorded as the top of the authenticated operators 30b.

Another example is, when the warning generating unit 22a generates the warning "[3]" indicating "optimization of feeder arrangement for minimizing the time necessary for exchanging feeder", the corresponding group of operations is "VII" (see FIG. 5 (A)). Furthermore, the level corresponding to the group of operations "VII" is "5" (see FIG. 5 (B)).

In this case, the warning notification unit 22c refers to the execution permission authentication information 21c, and specifies the operators "A", "B" to whom the execution permission authentication for level 5 is assigned. Furthermore, the warning notification unit 22c specifies "B", to whom execution permission authentication only for management work is assigned to management operations only from among the operators.

The warning notification unit 22c specifies the operator to notify the warning, and outputs the warning to notify the specified operator.

In this embodiment, the warning notification apparatus 40 transmits warning via the wireless LAN communication function included in the host computer 3, and transmits the warning to the information receiving terminal apparatus carried by the specified operator. This notifies the specified operator of the warning.

For example, when the operator "A" is specified, the warning notification unit 22c reads "P001", which is the ID of "A" from the execution permission authentication information 21c. The warning notification unit 22c further transmits the warning generated by the warning generating unit 22a and "POOL" to the host computer 3. The host computer 3 which received the information transmits received warning to the information receiving terminal apparatus corresponding to "P001".

With this, the warning notification device 40 can notify the warning to prompt the operator "A" whose ID is "P001" to perform the operations.

Note that the warning notification apparatus 40 may directly notify the warning to the specified operator without passing through the host computer 3. In this case, the warning notification apparatus 40 may include a communication function capable of transmitting the information to the information receiving terminal apparatus held by each operator.

In addition, the information receiving terminal apparatus to which the warning notification apparatus 40 outputs may not be limited to the specific embodiment, and may output the warning to various apparatuses.

For example, as shown in this embodiment, all operators may carry information receiving terminal apparatuses capable of displaying the details of warning. With this, each operator can check the details of warning when the operator is notified of the warning.

Here, a glass-type personal monitor attached to face may be adopted as a screen display apparatus in the information receiving terminal apparatus. In this case, by displaying screen for warning in a part of the operators' eyesight who received the warning can perform the operation while checking the details of warning, improving on the operability.

Furthermore, a simplified terminal apparatus which can display characters indicating that the warning is generated may be carried by each operator.

In this case, multiple operators share a receiving apparatus which is capable of display screen indicating the warning. Furthermore, the receiving apparatus is installed at a predetermined location.

The operator who received the warning directed to the operator himself at the simplified terminal from the simplified terminal apparatus accesses the predetermined location and checks the display screen of the receiving apparatus. With this, the warning notification apparatus 40 can notify the operator specified is by the warning notification apparatus 40 of the warning.

In addition, the simplified terminal apparatus may display information indicating that the warning is generated and the component mounter 50 where the warning is generated.

In this case, the operator who received the warning directed to the operator himself accesses the component mounter 50 shown in the simplified terminal apparatus, and checks the display details of the display unit 26 included in the component mounter 50. This also enables the warning notification apparatus 40 to notify the operator specified by the warning notification apparatus 40 of the warning. In addition, information indicating the detail of warning and the ID of the operator to be notified of the warning may also be notified to the information receiving terminal apparatuses of all operators.

In addition, for example, a large display apparatus is provided at a location where each operator can see the display, and the detail of the warning and the ID of the operator to be notified of the warning is sent may be displayed.

Furthermore, the notification of warning may be performed by audio only. For example, a speaker may be connected to the host computer 3, and audio indicating the detail of the warning and the ID of the operator to be notified of the warning may be outputted to the speaker.

Furthermore, the notification of the warning may be performed by lighting, flickering, and color of light, vibration of the information receiving terminal apparatus, or the combination of them, instead of characters, codes, graphic, or audio.

In this case, each operator may only have to recognize the correspondence of the type of lighting, and the details of warning and the operator to be notified of the warning.

In both cases, the warning to be generated is notified of the specified operator according to the level of the warning.

The execution permission judging unit 22d judges whether the operator who accesses the component mounter in order to take actions in response to the notification of a warning is assigned with the execution permission authentication for the level corresponding to the detail of the warning, by referring to the execution permission authentication information 21c.

Furthermore, the execution permission judging unit 22d permits execution of action to the operator according to the judgment result.

More specifically, at the production line, the operator who received the notification of warning does not necessarily perform the actions. For example, there are cases where the operator is not able to respond for some reason.

In such cases, it is necessary that another operator takes the actions in response to the notified warning by another operator.

However, the operator is not necessarily an operator who is assigned with the execution permission authentication for the response action. Thus, it is necessary to check whether the operator is assigned with the execution permission authentication.

For this reason, the operator who accessed the component mounter 50 is requested to input, for example, the operator's ID into the operating unit 25 of the component mounter. The warning processing unit 22 of the component mounter judges suitability of the execution permission to the operator based on the inputted ID and the execution permission authentication information 21c.

For example, when the operator "D" tries to exchange the feeder which ran out of components with a new feeder, and the operator "D" inputs his ID "P004" from the operating unit 25 to the component mounter 50. Furthermore, the operator "D" performs the predetermined operation to exchange the tape feeders 9 on the operating unit 25.

The execution permission judging unit 22d specifies that the group of operations corresponding to feeder exchange is "I" by referring to the information showing correspondence of the details of operations and the groups of operations (not shown).

The execution permission judging unit 22d further refers to the warning level judgment information 21b and the execution permission authentication information 21c. With this, it is confirmed that the operator whose ID is "P004" is assigned with "level 1", which corresponds to the group of operations "I".

After this confirmation, the execution permission judging unit 22d permits the exchange of feeders by the operator "D". For example, the execution permission judging unit 22d causes the display unit 26 to display that the operation is permitted, and causes the mechanism unit 18 to suspend operation for exchanging the tape feeders 9.

The recognition processing unit 24 recognizes and processes the result of imaging by the board recognition camera 15 and the component recognition camera 7. With this, the position of the board 4 on which the components are to be mounted, or position of the electronic components held by the mounting head 13 are recognized.

The operating unit 25 is an input unit such as a keyboard or a touch panel, and the operator performs input such as operating command and data input from the operating unit 25.

The display unit 26 is a display panel such as a liquid-crystal panel, and displays the guidance screen upon operation input to the operating unit 25 and various warnings.

The communication unit 27 transmits and receives signals with the control function of the component mounter 50 and other apparatus, or the host computer 3.

Next, the component mounter 50 performs operation when notifying the operator of the warning is described with reference to FIG. 6 and FIG. 7.

Figure 6:
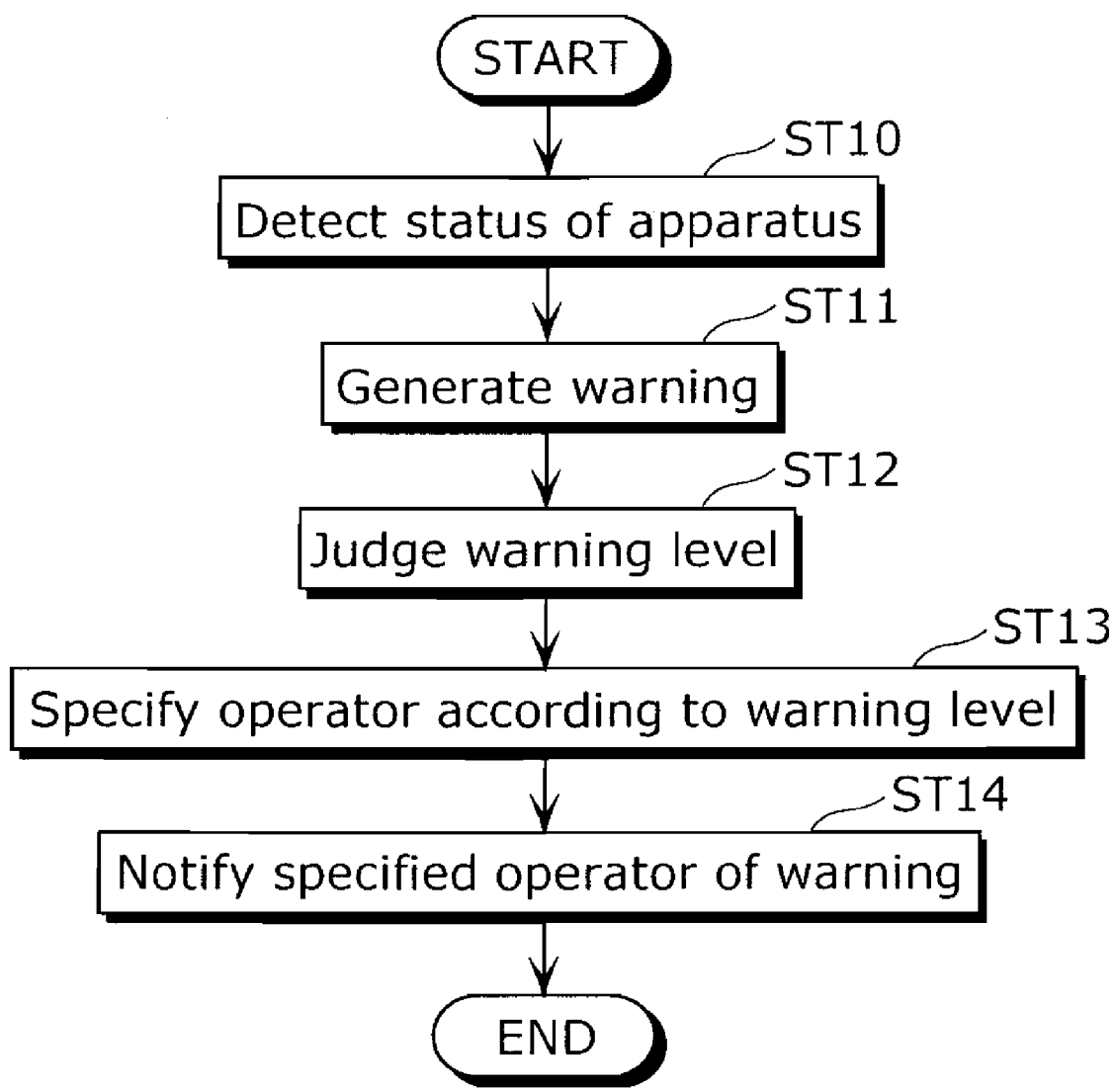
FIG. 6 is a flowchart showing the basic process flow when the component mounter according to the embodiment of the present invention performs warning notification process.

FIG. 6 is a flowchart showing the basic process flow of warning notification process by the component mounter 50.

In the component mounter 50, the sensor 35 detects mechanical status in the mechanism unit 18, and outputs the signal. Furthermore, the total control unit 20 outputs signals indicating some action is required, by executing the operation program (ST10).

The warning generating unit 22a receives signals from at least one of the sensor 35 and the total control unit 20. The warning generating unit 22a further generates warning corresponding to the type of received signal by referring to the warning generation information 21a (ST11).

More specifically, the warning generating unit 22a generates warning for notifying that the component mounter 50 requires some actions involving human resources by referring to the type of signals outputted from the sensor 35, the type of signals outputted from the total control unit 20 when the total control unit 20 executes the operating program, the warning generation information 21a associated with the type of signals outputted from the total control unit 20 and the type of warning (warning level generation process).

The warning level judging unit 22b refers to the warning level judgment information 21b and judges that the level corresponding to the notified group of operations. With this, the level of the warning is judged (ST12).

More specifically, the warning level judging unit 22b is a level of warning generated by the warning generating unit 22a, and judges the level indicating the difficulty of the actions to be taken in response to the warning by referring to the information related to the warning and the warning level judgment information 21b (warning level judging process).

The warning notification unit 22c specifies the operator corresponding to the level by referring to the execution permission authentication information 21c (ST13). The warning notification unit 22c outputs the warning to notify the specified operator (ST14).

More specifically, the warning notification unit 22c specifies the operator who is permitted to perform the actions according to the warning to be generated by the warning generating unit 22a by referring to the level judged by the warning level judging unit 22b and the information for identifying the operator, and outputs the warning to the specified operator for notification.

As described above, the warning notification unit 22c transmits the information showing the warning to be generated by the warning generating unit 22a and the information indicating the ID of the specified operator to the host computer 3 in this embodiment.

The host computer 3 transmits the information indicating the received warning addressed to the information receiving terminal corresponding to the ID.

This is the basic flow when the component mounter 50 notifies the operator of the warning.

In addition to the basic process, the component mounter 50 according to this embodiment performs processes such as recording the details of notification and judging the execution permission of the operation by the operator.

An example of process flow executed by the component mounter 50, including process other than the basic process described above is described with reference to FIG. 7.

Figure 7:
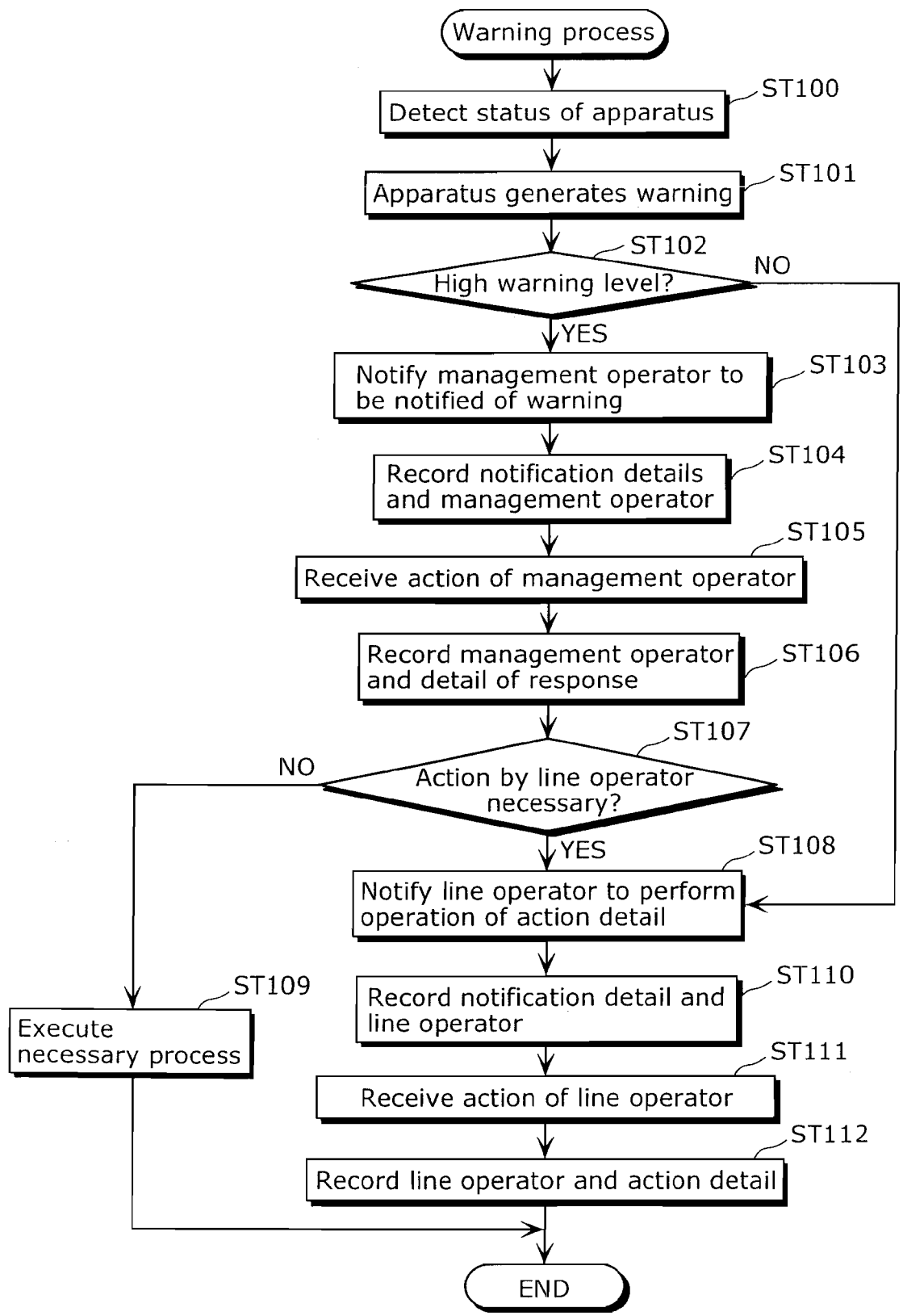
FIG. 7 is a flowchart showing an example of the process flow executed by the component mounter 50 according to the embodiment of the present invention.

FIG. 7 is a flowchart showing an example of the process flow executed by the component mounter 50 according to this embodiment.

First, when the apparatus is in operation, the sensor 35 detects the incident when the incident to be warned occurs, and the signal is outputted. In addition, a signal indicating that some actions are required such as increase in take time is outputted from the total control unit 20 (ST100).

The warning generating unit 22a generates a warning according to the types of these signals (ST101).

Next, the warning level judging unit 22b judges whether the level of the warning to be generated is high or not (ST102). Note that the level judged by the warning level judging unit 22b is "4" or "5", it is referred to as "high in level (high level)" (see FIG. 5 (B)).

Here, when the judgment by the warning level judging unit 22b shows that the level of the warning to be generated is in high level (YES in ST102), the warning notification unit 22c specifies an operator who takes a role of a line management engineer to whom the execution permission authentication for the level is assigned. The warning notification unit 22c further outputs the warning to notify the specified operator (ST103).

More specifically, the warning notification unit 22c specifies the operator to be notified of the warning by referring to the execution permission authentication information 21c indicated in FIG. 5 (C). Furthermore, the warning notification unit 22c transmits the information receiving terminal apparatus carried by the operator via the host computer 3.

Note that, upon specifying the operator to be notified, when multiple operators who are assigned to the same execution permission authentication, the operator is determined according to a predetermined order determined as a preference for determining the operator.

Furthermore, according to the warning notification, the detail of warning and the operator to be notified is recorded (ST104). More specifically, the log for production management, information combining the name or the ID code of the management operator to be notified and notification date are written as the warning notification recording data.

The warning notification recording data is assumed to be used as the basic data for evaluating and judging the progress of learning as well as the record of operation history of individual operator.

Note that, the production management log may be provided in the memory unit 21 in each component mounter, or may be provided in the database of the host computer 3.

In addition, the warning notification recording data into the production management log is performed by, for example, the warning notification unit 22c.

Next when the management operator who received the notification accessed the component mounter 50, the warning notification apparatus 40 in the component mounter 50 receives an action of the management operator (ST105).

More specifically, the execution permission judging unit 22d receives the ID of the management operator inputted from the operating unit 25, and refers to the execution permission authentication information 21c. With this, it is judged whether the management operator who accessed the component mounter 50 is an operator assigned with the execution permission authentication for the level corresponding to the detail of the warning. Furthermore, the execution permission judging unit 22d permits execution of action to the operator according to the judgment result (permission judging process).

Next, when the management operator performs the necessary judgment and finishes actions such as inputting a predetermined instruction from the operating unit 25, the name of management operator and the details of action (detail of response) is recorded (ST106).

For example, the execution permission judging unit 22d writes the information into the response recording data on the production management log.

The execution permission judging unit 22d judges whether the action of the line operator based on the action is necessary or not (ST107).

Note that the judgment is performed as described below, for example. After the completion of the operation by the management operator, the execution permission judging unit 22d judges whether it is necessary to generate a warning based on the type of signals outputted from the sensor 35 and the warning generation information 21a.

As a result of the judgment, when the answer is NO (NO in ST107), necessary process is performed by the function included in the component mounter 50 without requiring actions involving human resource by the operator (ST109).

Furthermore, when the result of judgment is YES (YES in ST107), the line operator to be notified is notified of the warning indicating the details of necessary operations (ST108).

More specifically, the warning generating unit 22a generates a warning and the warning level judging unit 22b judges the level of the warning.

The warning notification unit 22c then specifies the line operator to whom the execution permission authentication for the judged level is assigned. The warning notification unit 22c further transmits warning to the information receiving terminal apparatus carried by the line operator via the host computer 3.

Note that in the first warning level judging process by the warning level judging unit 22b (ST102), when it is judged that the level of warning is low (NO in ST102), the line operator is notified of the warning (ST108).

Together with the notification of the warning to the line operator, the detail of notification and information for identifying the line operator is recorded (ST110). More specifically, information combining the name or the ID code of the line operator to be notified and notification date are written on the log for production management as the warning notification recording data.

Writing the warning notification recording data is performed for the same purpose for recording the name or the like of the management operator as described above (ST106), and executed by the warning notification unit 22c, for example.

Next when the line operator who received the notification accessed the component mounter 50, the warning notification apparatus 40 in the component mounter 50 receives that an action of the management operator is performed (ST111).

More specifically, the execution permission judging unit 22d judges whether the execution permission authentication for the level corresponding to the details of the warning is assigned to the line operator who accessed the component mounter 50. The execution permission judging unit 22d permits execution of action to the line operator according to the judgment result (permission judging process).

Next, when the line operator finishes the action, the line operator who performed the action and the detail of the action (response detail) are recorded (ST112).

For example, the execution permission judging unit 22d writes the information into the response recording data on the production management log.

As described above, a series of warning notification process in the component mounter 50 ends.

As described above, the component mounter 50 according to this embodiment generates the warning for notifying that the component mounter 50 needs some action by referring to the warning generation information 21a. In addition, the level of warning to be generated is judged by referring to the warning level judgment information 21b.

In addition, the operator who is assigned with the execution permission authentication for the level is specified by referring to the execution permission authentication information 21c. Furthermore, the warning is outputted to notify the specified operator.

With this, certainty of the transmission to the operator originally to be notified can be improved by the warning to be notified. More specifically, the present invention enables effective use of the warning for enhancing productivity.

In addition, for each operator, the operations matching the operators own capability and assignment are requested, and thus each operator can effectively carry on operations without ineffective actions.

Note that, in this embodiment, the component mounter 50 includes the warning notification apparatus 40. More specifically, each of M2 to M5 includes the warning notification apparatus 40.

However, each of component mounters M2 to M5 may not include the warning notification apparatus 40. More specifically, the warning notification apparatus 40 may be in the component mounting system 1 as an apparatus independent of M2 to M5.

For example, the warning notification apparatus 40 may be realized as a CPU included in the host computer 3, a program, and a memory device.

In this case, the host computer 3 receives the output signals and the like from the sensor 35, and may generate or output warning from each of M2 to M5. In addition, the host computer 3 obtains ID or the operation detail inputted by the operator from each of M2 to M5, permission of execution of the operation may be judged by referring to the execution permission authentication information 21c.

This enables concentrated management of the details of troubles and actions in response to the troubles occurred in each of M2 to M5.

In addition, the warning notification apparatus 40 may notify the warning for notifying that the apparatuses included in the component mounting system requires some actions involving human resource.

The apparatuses included in the component mounting system for mounting the components on the board such as a board supplying apparatus that supplies boards to other apparatuses, a printer that prints cream solder on the boards, an adhesive applicator that applies adhesive on the boards, a reflow furnace for reflowing, and an external appearance checker for testing attachment status of the components may be monitored for notifying the warning.

Each of the apparatuses includes a sensor which detects the status of apparatus, and outputs signal according to the detected status. Furthermore, each of the apparatuses includes a control unit which operates the apparatus by executing the operating program. Furthermore, each of the apparatuses includes an operating unit which receives input of information and operation from the operator.

The warning notification apparatus 40 communicates one of the apparatus, and receives output signals at least from one of the sensor or the control unit. Furthermore, generation and output of warning, and execution permission are judged by referring to the warning generation information and the warning level judgment information according to the apparatus, based on the type of received signals.

In addition, permission of execution of the operation may be judged by acquiring ID or the operation detail inputted by the operator is obtained, by referring to the execution permission authentication information 21c.

Note that the process flow is the same as the process flow shown in FIGS. 6 and 7.

As described above, the warning notification apparatus 40 can transmit the warning regarding the communication counterpart apparatus to a suitable operator by communicating with each apparatus used for the mounting process.

In addition, the component mounter 50 according to this embodiment includes two mounting heads 13 arranged facing each other.

However, the apparatus to be monitored by the warning notification apparatus 40 for notifying the warning may be a component mounter having different configuration. For example, the apparatus may include only one mounting head for picking up components and mounting the components onto boards. Alternatively, for example, the component mounter may be a rotary component mounter.

In addition, the warning notification apparatus 40 according to this embodiment refers to the warning generation information 21a, the warning level judgment information 21b, and execution permission authentication information 21c as shown in FIG. 5 (A) to FIG. 5 (C) performs, from generation to output of the warning.

However, the number of tables may be other than three as long as information necessary for the process from generation to output of the warning.

For example, judging the warning level and specifying the operator may be performed by referring to one table.

FIG. 8 shows an example of data configuration of the execution permission authentication information 21d including information necessary for judging the warning level.

The execution permission authentication information 21d shown in FIG. 8 indicates correspondence between the groups of operations and levels, and levels and operators.

For example, when the warning generated by the warning generating unit 22a is "[3]", the group of operations corresponding to "[3]" is "VII" (see FIG. 5 (A)). In this case, the warning level judging unit 22b judges that the level corresponding to the group of operations is "5" by referring to the execution permission authentication information 21d.

In addition, the warning notification unit 22c can specify that the operators to whom the execution permission authentication for level 5 is assigned are "A" and "B" by referring to the execution permission authentication information 21d. In this case, the warning notification unit 22c specifies "B", to whom execution permission authentication is assigned to management operations only as the operator who performs the operations in response to the warning.

In addition, for example, generation of warning and judging of the warning level may be performed by referring to one table.

FIG. 9 shows an example of data configuration of the warning generation information 21e including information necessary for judging the warning level.

The warning generation information 21e shown in FIG. 9 indicates the correspondence between the type of signal and the type of warning, and the type of warning and the level of warning. More specifically, the warning generation information 21e includes information indicating correspondence between types of warning related to the warning and levels.

For example, when the warning generating unit 22a receives signals "d" and "e", the warning generating unit 22a generates the warning "[3]" by referring to the warning generation information 21e. In this case, the warning level judging unit 22b refers to the warning generation information 21e and judges that the level corresponding to the notified group of operations is "5".

As described above, the group of information included in the warning notification apparatus 40 is not limited to a specific grouping as long as the group of information enables the generation of warning, judging of the level of warning to be generated, and identification of the operator corresponding to the warning to be generated.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The component mounter, warning notification apparatus, and the warning notification method improves certainty of transmission of the warning to be notified to the operator who is originally to be notified, thereby effectively using the detail of warning for enhancing the productivity. Therefore, the present invention is useful for a system and an apparatus which mounts electronic components onto boards and manufactures mounted boards.

What is claimed is:

1. A component mounter provided with a component mounting mechanism which picks up a component from a component supply unit, transfers and mounts the component on a board transported by a board transport mechanism, a position of the board determined and held by a board positioning unit, said component mounter comprising:

a control unit configured to operate a mechanism unit by executing an operating program, the mechanism unit including at least the component mounting mechanism, the component supply unit, the board transport mechanism, and the board positioning unit;

a sensor which detects a mechanical status of the mechanism unit and outputs a signal according to the detected status;

a warning generating unit configured to generate a warning, by referring to warning generation information in which a type of the signal outputted from said sensor or a type of the signal outputted from said control unit when said control unit executes the operating program, and a type of the warning are associated with each other, the warning being for notifying that an action involving human resource is required;

a warning level judging unit configured to judge a level of the warning by referring to warning level judgment information in which information related to the warning and the level of the warning are associated with each other, the warning being generated by said warning generating unit, and the level of the warning indicating difficulty of an action to be taken in response to the warning; and a warning notification unit configured to specify an operator permitted to perform the action in response to the warning by referring to execution permission authentication information in which the level and information for identifying the operator are associated with each other, the warning generated by said warning generating unit, and the level of warning judged by said warning level judging unit, and to output the warning notifying the specified operator of the warning.

2. The component mounter according to claim 1, further comprising a permission judging unit configured to judge whether or not an operator who accessed said component mounter to perform the action is the operator who is assigned with the execution permission authentication for the level judged by said level judging unit, by referring to the execution permission authentication information, and to assign permission to execute the action to the operator according to a result of the judgment.

3. The component mounter according claim 1, wherein said warning notification unit is configured to notify the operator of the warning by transmitting the generated warning to an information receiving terminal apparatus carried by the specified operator.

4. The component mounter according to claim 1, further comprising a memory unit configured to store the warning generation information, the warning level judgment information, and the execution permission authentication information.

5. A warning notification apparatus which notifies a warning that an apparatus included in a component mounting system for mounting a component on a board requires an action involving a human resource,
  wherein the apparatus included in the component mounting system include:
    a control unit configured to operate the apparatus through execution of an operating program; and
    a sensor which detects a mechanical status of the apparatus and outputs a signal according to the detected status, and
  said warning notification apparatus comprises:
    a warning generating unit configured to generate a warning, by referring to warning generation information in which a type of the signal outputted from the sensor or a type of the signal outputted from the control unit when the control unit executes the operating program, and a type of the warning are associated with each other;
    a warning level judging unit configured to judge a level of the warning by referring to warning level judgment information in which information related to the warning and the level of the warning are associated with each other, the warning being generated by said warning generating unit, and the level of the warning indicating difficulty of an action to be taken in response to the warning; and
    a warning notification unit configured to specify an operator permitted to perform the action in response to the warning by referring to execution permission authentication information in which the level and information for identifying the operator are associated with each other, the warning generated by said warning generating unit, and the level of warning judged by said warning level judging unit, and to output the warning notifying the specified operator of the warning.

6. The warning notification apparatus according to claim 5, wherein the apparatus included in the component mounting system is one of a board supply apparatus which supplies a board to another apparatus, an printer which applies cream solder on the board, an adhesive applicator which applies adhesive on the board, a component mounter which mounts the component on the board, a reflow furnace which performs reflowing, and an exterior tester which tests a mounting status and so on of the component.

7. A warning notification method performed by a warning notification apparatus which notifies that a component mounter which picks up, by a component mounting mechanism, a component from a component supply unit, transfers and mounts the component on a board transported by a board transport mechanism, a position of the board determined and held by a board positioning unit, requires an action involving a human resource,
  wherein the component mounter includes:
    a control unit configured to operate, by executing an operating program, a mechanism unit including at least the component mounting mechanism, the board transport mechanism, the component supply unit, and the board positioning unit; and
    a sensor which detects a mechanical status of the mechanism unit and outputs a signal according to the detected status,
  said warning notification method comprises:
    generating a warning by referring to warning generation information in which a type of the signal outputted from the sensor or a type of the signal outputted from the control unit when the control unit executes the operating program, and a type of the warning are associated with each other, the warning being for notifying that an action involving human resource is required;
    judging a level of the warning by referring to warning level judgment information in which information related to the warning and the level of the warning are associated with each other, the warning generated in said generating and the level of the warning indicating difficulty of an action to be taken in response to the warning;
    specifying an operator permitted to perform the action in response to the warning by referring to execution permission authentication information in which the level judged by said warning level judging unit and information for identifying the operator are associated with each other, the warning generated by the warning generating unit; and
    outputting the warning to notify the specified operator of the warning.

8. The warning notification method according to claim 7, further comprising:
  judging whether or not an operator who accessed the component mounter to perform the action is the operator who is assigned with the execution permission authentication for the level judged by said level judging unit by referring to the execution permission authentication information, and to assign permission to execute the action to the operator according to a result of the judgment; and
  assigning permission to execute the action to the operator according to a result of the judgment.

* * * * *